July 2, 1957 G. F. BAROCH 2,798,206

HIGH FREQUENCY COUPLING DEVICE

Filed Sept. 23, 1953

INVENTOR.
George F. Baroch,
BY
Foorman L. Mueller
Atty.

United States Patent Office 2,798,206

Patented July 2, 1957

2,798,206

HIGH FREQUENCY COUPLING DEVICE

George F. Baroch, Lombard, Ill., assignor to Motorola, Inc., Chicago, Ill., a corporation of Illinois Application September 23, 1953, Serial No. 381,863

5 Claims. (Cl. 333—73)

The present invention relates to television receivers and more particularly to an improved high frequency coupling device that may be incorporated in an ultra-high frequency tuner for a television receiver.

Due to the rapid advances that have recently been made in the television industry, the demand has arisen for more and more television signal channels beyond the capacity of the present "very-high" frequency band. In response to this demand, the Federal Communications Commission has authorized the use of a higher frequency band termed the "ultra-high" frequency band for television. It is therefore necessary to incorporate in present television receivers a suitable tuning system for enabling such receivers to be tuned through the new ultra-high frequency band as well as through the very-high frequency band in which they normally operate.

The above mentioned ultra-high frequency tuning system usually comprises a unit connected between the antenna and the radio frequency amplifier of the usual television receiver. This unit usually includes a heterodyne stage for converting the signals in the ultra-high frequency band to a frequency that may be conveniently utilized by the receiver, and the unit also includes a tuning arrangement for providing continuously tuning through the ultra-high frequency band. An appropriate ultra-high frequency tuning unit is disclosed, for example, in copending application, Serial No. 301,102, entitled "Converter" filed in the name of Frihart and Baroch on July 26, 1952, now Patent No. 2,770,724, issued November 13, 1956, and assigned to the present assignee.

The ultra-high frequency tuner or converter disclosed in the copending application referred to above, includes a variable coupling device for tuning the input of the converter through the ultra-high frequency band. The coupling device described in the application comprises in one embodiment a pair of intercoupled capacitively loaded tunable coaxial lines. The input of the coupling device is connected to an ultra-high frequency antenna and the output of the device is coupled to the heterodyne mixer stage of the converter.

For efficient operation, it is desirable that the coupling device exhibits substantially critical coupling between the antenna and the heterodyne mixer throughout the entire ultra-high frequency band, and also that the device exhibits a uniform bandpass characteristic. It has been found, however, that due to mechanical limitations, the desired criteria are sometimes difficult to achieve with the coupling device disclosed in the copending application, and that the device exhibits slight overcoupling at one end of the ultra-high frequency band and slight undercoupling at the other end with the resulting variations in bandpass characteristics and energy transfer.

It is, accordingly, an object of the present invention to provide an improved variable coupling device which may be of the type discussed above, and which is so constructed that it exhibits uniform coupling characteristics throughout the entire ultra-high frequency band.

A more general object of the invention is to provide an improved variable coupling device that is tunable through a wide range of frequencies, and which exhibits uniform coupling characteristics throughout the entire frequency range.

A feature of the invention is the provision of an improved variable high frequency coupling device that incorporates an extremely simple compensating network to enable the device to exhibit uniform coupling characteristics throughout the entire frequency band through which it is tuned.

Another feature of the invention is the provision of an improved high frequency coupling device that comprises a pair of coaxial lines, each tunable through a selected frequency range; the lines being coupled together by means of a coupling loop that transfers energy from one to the other and which has a reverse section that opposes such transfer of energy in a manner to compensate for any variation in the coupling characteristics of the device as it is tuned through the selected frequency range.

The above and other features of the invention which are believed to be new are set forth with particularity in the appended claims. The invention itself, however, together with further objects and advantages thereof, may best be understood by reference to the following description when taken in conjunction with the accompanying drawing in which:

The invention provides a high-frequency coupling device which comprises a first coaxial line having a cylindrical outer conductor and an inner conductor longitudinally movable therein to tune the line, and a second coaxial line having a cylindrical outer conductor and an inner conductor longitudinally movable therein to tune the second line. A first coupling means is coupled to the inner conductor of the first coaxial line for introducing energy to the first line and a second coupling means is coupled to the inner conductor of the second line for deriving energy from the second line. A first coupling section is coupled to the inner conductors of the first and second coaxial lines for transferring energy from the first to the second line, and this section has a coupling coefficient that varies with tuning variations of the lines. A second coupling section is also coupled to the inner conductors of the first and second coaxial lines for opposing the energy transfer by the first coupling section by an amount varying with tuning variations of the lines to compensate for the variations in the coupling coefficient of the first coupling section.

Figure 1:
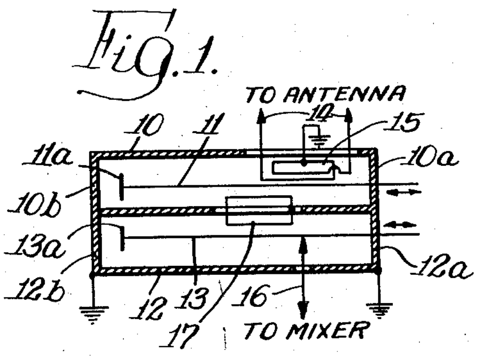
Figure 1 is a schematic representation of the high frequency coupling device disclosed in the copending application referred to previously herein.

Referring now to Figures 1–6, the improved coupling device disclosed in Figure 1 includes a first coaxial line comprising an outer cylindrical conductor 10 (shown in section), and an inner conductor 11 slidable longitudinally within conductor 10. Conductor 11 is short-circuited to one end 10*a* of conductor 10 and is capacitively coupled to the other end 10*b* of conductor 10 by the end portion 11*a*.

The coupling device also includes a second coaxial line which comprises an outer cylindrical conductor 12 (shown in section) and an inner conductor 13 slidable therein. The inner conductor 13 is short-circuited to one end 12*a* of conductor 12 and is capacitively coupled to the other end 12*b* of the conductor by a capacitive element 13*a*. The outer cylindrical conductors 10 and 12 are connected to ground as shown.

The coupling device may be connected to a suitable ultra-high frequency antenna through the usual lead-in conductors 14 and these conductors are connected to a coupling loop 15 within conductor 10, the coupling loop being inductively coupled to the inner conductor 11 and having a center point connected to ground for balanced input coupling. A lead 16 is conductively connected to conductor 13 to derive energy from the coupling device, and the lead may be connected to the mixer heterodyne stage of the ultra-high frequency converter. Conductor 11 is coupled to conductor 13 by means of a rectangular coupling loop 17 extending through the outer conductors 10 and 12 and having one end connected through the outer conductors to ground.

Energy from the antenna is induced in conductor 11 by means of coupling loop 15, and the arrangement is such that resonance occurs when the conductor is a quarter of a wave length long. Therefore, the coaxial line 10, 11 responds to a particular signal when conductor 11 is adjusted to have a length corresponding to one quarter of the wave length of that signal. The particular signal is induced in conductor 13 through coupling loop 17 when conductor 13 is also adjusted to have a length corresponding to a quarter of the wave length of that signal. The signal is derived from conductor 13 by lead 16 and applied to the mixer of the converter. The device provides, therefore, a double tuned coupling network tunable through the ultra-high frequency band.

The capacitive loading of the inner conductors 11 and 13 by the capacitive coupling between end portions 11*a* and 13*a* and the respective ends 10*b* and 12*b* of the outer conductors enables the device to be tuned through the 470–900 megacycle ultra-high frequency band without the need for the inner and outer conductors to have excessive lengths. The device of Figure 1 may, therefore, be tuned through the ultra-high frequency band by moving the inner conductors 11 and 13 in unison.

It is desirable that the coupling device of Figure 1 exhibits uniform coupling characteristics for all settings of the device throughout the entire ultra-high frequency range. However, it has been found that when loop 17 is arranged to provide critical coupling around the middle of the range that overcoupling occurs at the high end of the range and undercoupling occurs at the low end. Also, it has been found that the coupling loop 15 and the conductive connection of lead 16 contribute to the variation in coupling and bandpass characteristics of the device as it is tuned through the range.

Figure 2:
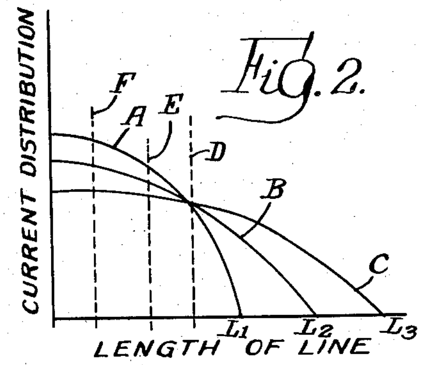
Figures 2 and 3 are curves showing the characteristics of the coupling device of Figure 1.
Figure 3:
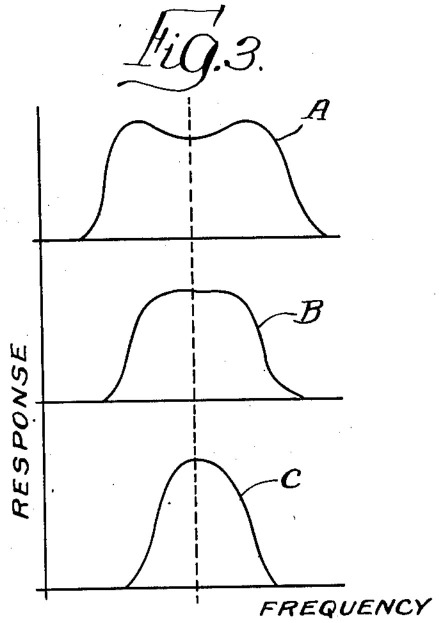

Since the inner conductors 11 and 13 are short-circuited at one end to ground and capacitively loaded at the other, a current wave appears along these lines when the device is tuned to a particular signal. This current wave has maximum amplitude at the shorted end and minimum amplitude at the capacitively loaded end of each of the inner conductors. Such a current wave for three different signals corresponding to three settings of the inner conductors 11, 13 is shown in Figure 2. The current wave "A" occurs when the inner conductors have a relatively small length $L_1$ corresponding to a signal at the high frequency end of the band. A second current wave "B" occurs when the inner conductors have a length $L_2$ corresponding to a signal in the middle of the band, and a third current wave "C" occurs when the inner conductors have a relatively large length $L_3$ corresponding to a signal at the low frequency end of the band. These three current waves have a substantial cross-over position occurring at line "D" and, if loop 17 could be extended to embrace a position corresponding to the position of line "D," the signal induced from 11 to line 13 by loop 17 would be essentially constant throughout the frequency range. The device then would exhibit essentially constant coupling characteristics which are desired.

However, due to the mechanical construction of the device, it has been found impractical to extend coupling loop 17 to this position. The practical position of the coupling loop corresponds to the position of line E of Figure 2. It can be seen that more signal is induced through coupling loop 17 for curve A than for curve C when the coupling loop has a position corresponding to line E, and that the current induced for curve B is intermediate the other two. Therefore, with the coupling loop in the latter position, the coupling coefficient varies as the device is tuned through the frequency band. When the loop is adjusted for critical coupling in the mid-band, such coupling occurs for curve B and the bandpass characteristic for this particular position is shown in curve B of Figure 3. This curve represents critical coupling and it is desired to maintain such a characteristic throughout the range. However, when the inner conductors 11 and 13 are moved to position $L_1$, overcoupling occurs, such as shown in curve A of Figure 3; and when the conductors are moved to the low frequency position $L_3$, undercoupling occurs as shown in curve C of Figure 3.

Figure 4:
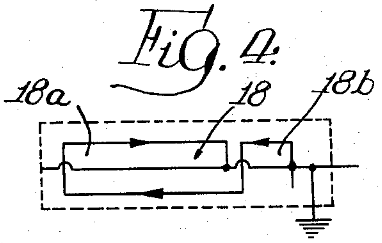
Figures 4 and 5 show various coupling loops to be incorporated in the coupling device of Figure 1 in accordance with the present invention.

In accordance with one embodiment of the invention, coupling loop 17 is replaced by the coupling loop 18 of Figure 4. Coupling loop 18 has a main rectangular-shaped coupling section 18*a* and also has a reversed end section 18*b*. One end of the loop section 18*a* is opened with one lead connected to ground and the other formed into the reverse loop section 18*b*. The end of section 18*b* remote from section 18*a* is connected to ground. In this manner, the current induced in coupling loop 18 is in the direction shown by the arrows with the current in section 18*b* opposing the current in section 18*a*.

When the coupling loop of Figure 4 is incorporated in the device of Figure 1, the main coupling section 18*a* is positioned to correspond to line E of Figure 2, and the reverse coupling section 18*b* is positioned to correspond to line F. Therefore, the main coupling section 18*a* exhibits the same characteristics as coupling loop 17 of Figure 1, while reverse coupling section 18*b* exhibits even more exaggerated coupling variations as the device is tuned through the frequency range. In this manner, the loop of Figure 4 can be constructed so that the reverse section 18*b* opposes the coupling section 18*a* by an amount varying as the tuning of the device is varied so as to compensate for the variations in coupling due to coupling section 18*a*.

The coupling loop 18 may conveniently be printed or plated on a suitable insulating panel which, in turn, is mounted between the outer conductors 10 and 12 of the device of Figure 1 to transfer the energy from one of the coaxial lines to the other.

Figure 5:
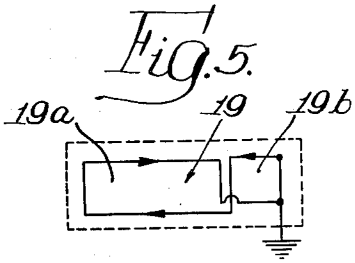

The coupling loop of Figure 5 is essentially similar to the loop of Figure 4 and includes a coupling loop 19 having a main coupling section 19*a* and a reverse coupling section 19*b*. In the loop of Figure 5, both ends of the main coupling section 19*a* are reversed and return to ground in the manner shown to produce an essentially rectangular opposing coupling section 19*b*.

Figure 6:
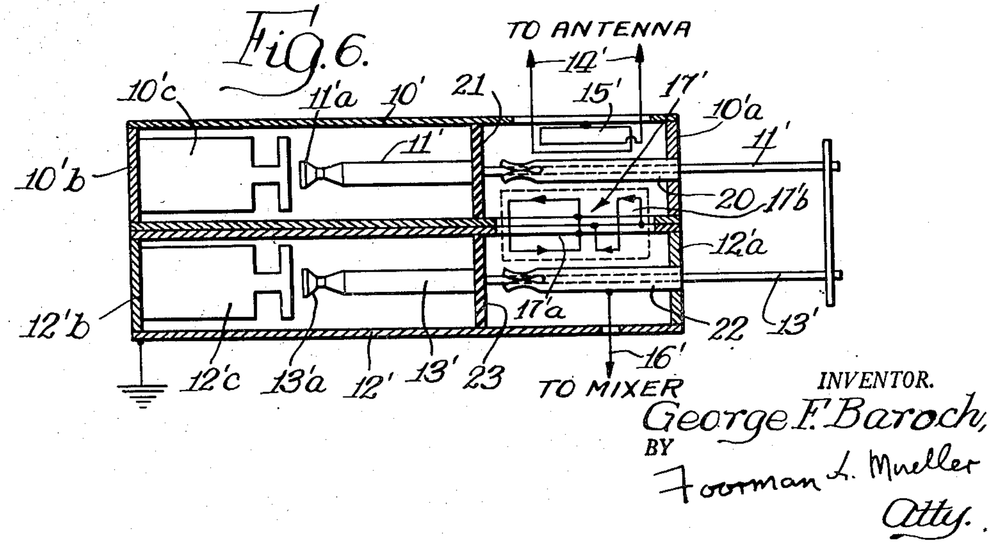
Figure 6 is a mechanical representation of one embodiment of the improved coupling device of the invention.

The device of Figure 6 includes a first coaxial line comprising an outer cylindrical conductor 10′ and an inner conductor 11′. The outer conductor 10′ has one end closed by a metallic section 10*a*′ and the inner conductor 11′ extends through that end and is slidably held within a sleeve 20 secured to and electrically connected to the end 10*a*′. Sleeve 20 holds the inner conductor 11′ frictionally so that the inner conductor may be moved back and forth within the outer conductor 10′ and yet maintain electrical connection with the end 10*a*′ through the sleeve. The device also includes an insulating disc 21 which is secured to the inner conductor 11′ and moves with the inner conductor to maintain it centrally disposed within outer conductor 10′.

The inner conductor 11′ has an end portion 11*a*′ which is capacitively coupled to the end 10*b*′ of cylindrical conductor 10′. The end 10*b*′ has a cylindrical-shaped capacitive member 10c' secured thereto and extending along the interior of conductor 10' toward the end portion 11a' of conductor 11'. The end portion 11a' and the capacitive member 10c' are shaped to achieve linearity as the device is tuned from one end of the frequency range to the other.

The device also includes a second coaxial line comprising an outer cylindrical conductor 12' and an inner conductor 13. The construction of the second coaxial line is similar to the first coaxial line with the inner conductor 13' extending through a resilient sleeve 22 connected to the end 12a' of the cylindrical outer conductor 12', and the inner conductor having an insulating centering disc 23 supported thereon. Similarly, inner conductor 13' has an end portion 13a', and the end 12b' of conductor 12' has a capacitive member 12c' capacitively coupled to the end portion, the end portion 13a' and member 12c' being shaped so that tuning linearity may likewise be obtained in the second coaxial line. Input energy is fed to the device through a coupling loop 15' connected, for example, to an appropriate antenna through lead-in conductors 14'. The outer conductors 10' and 12' are connected to ground. A lead 16' is connected to sleeve 22 to establish a connection to inner conductor 13'; and lead 16' may, for example, be connected to the heterodyne mixer of an ultra-high frequency converter.

Conductors 11' and 13' are inductively coupled through a coupling unit 17' which, in this instance, may include a main rectangular coupling section 17'a and an S shaped reverse coupling section 17'b, these coupling sections being separate and distinct from one another. The main coupling section 17'a transfers energy from one line to another, but has a coupling coefficient that varies with variations in tuning of the lines throughout the frequency range. Coupling section 17'b, on the other hand, opposes the transfer of energy by the main coupling section in such a manner as to compensate for the variations in coupling coefficient.

The invention provides, therefore, an improved high frequency coupling device which is relatively simple in its construction and which may be tuned through a relatively wide frequency range without any material variation in the coupling characteristics of the device.

While particular embodiments of the invention have been shown and described, modifications may be made and it is intended in the appended claims to cover all such modifications as fall within the true spirit and scope of the invention.

I claim:

1. A high frequency coupling device including in combination, a first coaxial line comprising a cylindrical outer conductor and an inner conductor capacitively coupled to said outer conductor at a first end and conductively connected thereto at the second end, said inner conductor being longitudinally movable therein to tune said line, a second coaxial line comprising a cylindrical outer conductor and an inner conductor capacitively coupled to the outer conductor of said second line at the first end and conductively connected thereto at the second end, said last named inner conductor being longitudinally movable therein to tune said second line, a first coupling means coupled to said inner conductor of said first coaxial line for introducing energy to said first line and establishing respective current waves on the inner conductor thereof corresponding to certain positions of such inner conductor, a second coupling means coupled to said inner conductor of said second coaxial line for deriving energy from said second line, a first coupling loop coupled to said inner conductors of said first and second coaxial lines for transferring energy from said first to said second coaxial line with the amount of energy transferred thereby being a function of the location of said first coupling loop along said lines and with such energy transfers being subject to vary for different ones of said current waves for all practical location of said first coupling loop, said first coupling loop being positioned along said lines to have a coupling coefficient that varies with tuning variations of said lines, and a second coupling loop coupled to said inner conductors of said first and second coaxial lines and located between said first coupling loop and said second ends of said lines at a position in which the energy transfer of said second coupling loop is a function of the tuning of said lines, said second loop being connected to oppose the aforesaid energy transfer by said first coupling loop by an amount varying with tuning variations of said lines to compensate for the aforesaid variation in the coupling coefficient of said first loop.

2. A high frequency coupling device including in combination, a first coaxial line comprising a cylindrical outer conductor and an inner conductor longitudinally movable therein to tune said line, a second coaxial line comprising a cylindrical outer conductor and an inner conductor longitudinally movable therein to tune said second line, a first coupling means coupled to said inner conductor of said first coaxial line for introducing energy to said first line and establishing respective current waves on the inner conductor thereof corresponding to different positions of such inner conductor, a second coupling means coupled to said inner conductor of said second coaxial line for deriving energy from said second line, and an energy-transferring third coupling means coupled to said inner conductors of said first and second coaxial lines with the amount of energy transferred thereby being a function of the location of said third coupling means along said coaxial lines with such energy transfer being subject to vary for different ones of said current wave for all practical location of said third coupling means, said third coupling means including a first section for transferring energy from said first to said second coaxial line and so located along said lines as to have a coupling coefficient that varies with tuning variations of said lines, and said third coupling means including a second section so located along said coaxial lines as to have a coupling coefficient that varies with tuning variations of said lines and connected to oppose the aforesaid energy transfer by said first section by an amount varying with tuning variations of said lines to compensate for the aforesaid variation in the coupling coefficient of said first section.

3. A high frequency coupling device including in combination, a first coaxial line comprising a cylindrical outer conductor and an inner conductor longitudinally movable therein to tune said line, said inner conductor being capacitively coupled to said outer conductor at a first end of said line and conductively connected thereto at the second end thereof, a second coaxial line disposed adjacent said first line and comprising a cylindrical outer conductor and an inner conductor longitudinally movable therein to tune said second line, said inner conductor of said second line being capacitively coupled to the outer conductor thereof at the first end and conductively connected to such outer conductor at the second end, coupling means coupled to said inner conductor of said first coaxial line for introducing energy to said first line and establishing respective current waves on the inner conductor thereof for different positions of such inner conductor, a second coupling means coupled to said inner conductor of said second coaxial line for deriving energy from said second line, a rectangular coupling loop interposed between said coaxial lines and inductively coupled to said inner conductors thereof for transferring energy from said first to said second coaxial line with the amount of energy transferred by said coupling loop being a function of the location of said loop along said coaxial lines and with such energy transfer being subject to vary for different ones of said current waves for all practical location of said coupling loop, said coupling loop being located along said coaxial lines to have a coupling coefficient that varies with tuning variations of said lines, and a substantially S-shaped coupling loop positioned between said rectangular coupling loop and the second ends of said lines and located to have a coupling coefficient that varies with tuning variations of said line for opposing the aforesaid energy transfer by said first coupling loop by an amount varying with tuning variations of said lines to compensate for the aforesaid variation in the coupling coefficient of said first loop.

4. A high frequency coupling device including in combination, a first coaxial line comprising a cylindrical outer conductor and an inner conductor longitudinally movable therein to tune said line, said inner conductor being capacitively coupled to said outer conductor at a first end of said line and conductively connected thereto at the second end thereof, a second coaxial line disposed adjacent said first line and, comprising a cylindrical outer conductor and an inner conductor longitudinally movable therein to tune said second line, said inner conductor of said second line being capacitively coupled to said outer conductor thereof at the first end of said second line and being conductively connected thereto at the second end thereof, coupling means coupled to said inner conductor of said first coaxial line for introducing energy to said first line and establishing respective current waves on the inner conductor thereof for different positions of such inner conductor, a second coupling means coupled to said inner conductor of said second coaxial line for deriving energy from said second line, a rectangular coupling loop interposed between said coaxial lines and inductively coupled to said inner conductors thereof for transferring energy from said first to said second coaxial line with the amount of energy transferred thereby being a function of the location of said coupling loop along said coaxial lines with such energy transfer being subject to vary for different ones of said current waves for all practical locations of said loop, said coupling loop being located along said lines to have a coupling coefficient that varies with tuning variations of said lines, and said coupling loop having an inverted end section located to have a coupling coefficient that varies with tuning variations of said line so as to oppose the aforesaid energy transfer by said loop by an amount varying with tuning variations of said lines to compensate for the aforesaid variation in the coupling coefficient of said loop.

5. A high frequency coupling device including in combination, a first coaxial line comprising a cylindrical outer conductor and an inner conductor longitudinally movable therein to tune said line through a selected frequency range, said inner conductor being capacitively coupled to said outer conductor at a first end of said line and being conductively connected thereto at the second end thereof, a second coaxial line disposed adjacent said first line and comprising a cylindrical outer conductor and an inner conductor longitudinally movable therein to tune said second line through a corresponding frequency range, said inner conductor of said second line being capacitively coupled to said outer conductor thereof at the first end of said second line and being conductively connected to such outer conductor at the second end thereof, a first coupling loop extending through said outer conductor of said first coaxial line and inductively coupled to said inner conductor thereof for introducing energy to said first line and establishing respective current waves on the inner conductor thereof for different positions of such inner conductor, a lead conductively connected to said inner conductor of said second coaxial line and extending through said outer conductor thereof for deriving energy from said second line, a rectangular coupling loop interposed between said coaxial lines, said rectangular coupling loop extending through said outer conductors of said coaxial lines and inductively coupled to said inner conductors thereof for transferring energy from said first to said second coaxial line with the amount of energy transferred thereby being a function of the location of said rectangular coupling loop along said coaxial lines with such energy transfer being subject to vary for different ones of said current waves for all practical locations of said rectangular coupling loop, said rectangular coupling loop being located so that the coupling coefficient thereof varies as the tuning of said lines is varied through the aforesaid frequency range, and said rectangular coupling loop having an inverted end section facing said second ends of said lines and located to have a coupling coefficient that varies as the tuning of said line is varied through the aforesaid frequency range for opposing the aforesaid energy transfer by said rectangular loop by a varying amount as the tuning of said lines is varied through the aforesaid frequency range to compensate for the aforesaid variation in the coupling coefficient of said rectangular loop.

References Cited in the file of this patent

UNITED STATES PATENTS

| | | |
|---|---|---|
| 2,218,223 | Usselman et al. | Oct. 15, 1940 |
| 2,312,783 | Trevor | Mar. 2, 1943 |
| 2,513,761 | Tyson | July 4, 1950 |
| 2,524,532 | Linder | Oct. 3, 1950 |

FOREIGN PATENTS

| | | |
|---|---|---|
| 887,367 | France | Aug. 9, 1943 |